(12) United States Patent
Ruf et al.

(10) Patent No.: US 9,237,684 B2
(45) Date of Patent: Jan. 12, 2016

(54) MEASUREMENT TRANSMITTER

(71) Applicant: Endress + Hauser GmbH + Co. KG, Maulburg (DE)

(72) Inventors: Klaus Ruf, Rheinfelden (DE); Ralph Stib, Schonau (DE)

(73) Assignee: Endress + Hauser + GmbH + Co. KG, Maulburg (DE)

( * ) Notice: Subject to any disclaimer, the term of this patent is extended or adjusted under 35 U.S.C. 154(b) by 0 days.

(21) Appl. No.: 14/376,942

(22) PCT Filed: Nov. 22, 2012

(86) PCT No.: PCT/EP2012/073316
§ 371 (c)(1),
(2) Date: Aug. 6, 2014

(87) PCT Pub. No.: WO2013/087388
PCT Pub. Date: Jun. 20, 2013

(65) Prior Publication Data
US 2015/0016075 A1 Jan. 15, 2015

(30) Foreign Application Priority Data
Dec. 12, 2011 (DE) .......................... 10 2011 088 302

(51) Int. Cl.
*G01D 11/24* (2006.01)
*H05K 9/00* (2006.01)
*G01F 15/00* (2006.01)
*G01F 15/14* (2006.01)
*G01F 23/00* (2006.01)
*H05K 7/14* (2006.01)

(52) U.S. Cl.
CPC ............ *H05K 9/0007* (2013.01); *G01D 11/245* (2013.01); *G01F 15/00* (2013.01); *G01F 15/14* (2013.01); *G01F 23/00* (2013.01); *H05K 7/1427* (2013.01)

(58) Field of Classification Search
CPC ........... H01L 2224/48091; H01L 2924/00014; G01D 11/24
USPC ........................................................ 73/431
See application file for complete search history.

(56) References Cited

U.S. PATENT DOCUMENTS 5,546,804 A * 8/1996 Johnson et al. ................. 73/431
7,190,053 B2 * 3/2007 Orth et al. ..................... 257/659
2006/0055006 A1 3/2006 Orth

OTHER PUBLICATIONS

German Search Report, German Patent Office, Munich, Jul. 4, 2012.
International Search Report, EPO, The Netherlands, Apr. 19, 2012.
English translation of the IPR, WIPO, Geneva, Jun. 26, 2014.

* cited by examiner

*Primary Examiner* — Lisa Caputo
*Assistant Examiner* — Jamel Williams
(74) *Attorney, Agent, or Firm* — Bacon & Thomas, PLLC

(57) ABSTRACT

A measurement transmitter for providing a measured value to a control system, comprising: a sensor having a transducer for outputting a primary signal dependent on the measured value; a first electronic circuit for processing the primary signal to an intermediate signal; a second electronic circuit for processing the intermediate signal to a signal representing the measured value, wherein the second electronic circuit has a signal output for outputting the signal to connection lines; a housing arrangement having a metal material, wherein the first electronic circuit has at least a first circuit carrier, and the second electronic circuit has at least a second circuit carrier, and wherein the first and second electronic circuits are positioned in the housing arrangement spaced from one another. Electrically conducting shielding and high frequency filters for protecting against HF disturbances, which can get into the housing arrangement via the connection lines. The electrically conducting shielding and the high frequency filters are arranged between the first and second circuit carriers.

6 Claims, 1 Drawing Sheet

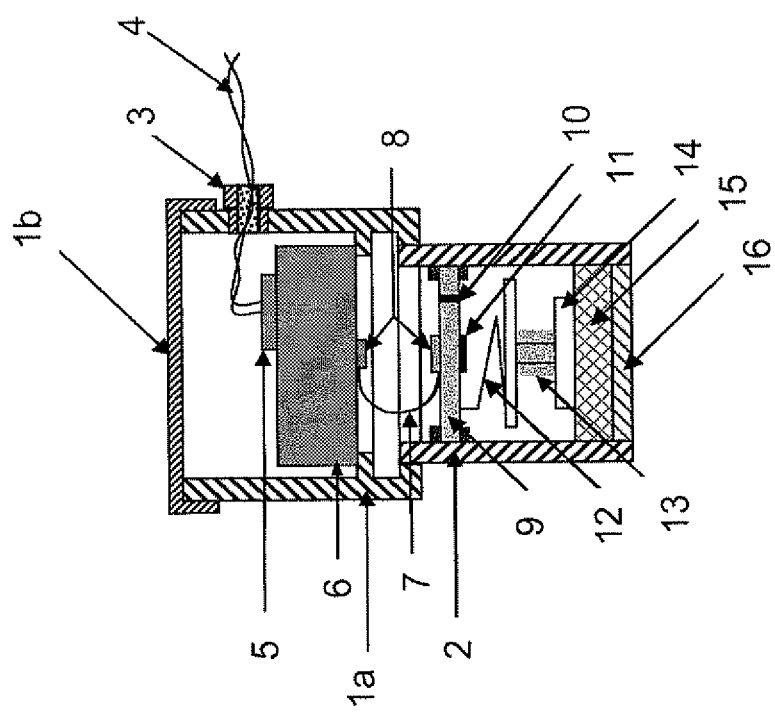

MEASUREMENT TRANSMITTER

TECHNICAL FIELD

The present invention relates to a measurement transmitter, especially a measurement transmitter for providing a measured value of at least one measured variable, especially a process parameter of a medium, to a control system. Usual process parameters of a medium include, for example, absolute pressure, relative pressure, and pressure difference, fill level, temperature, mass flow, volume flow, density, viscosity, pH-value and other potentiometric measured variables, oxygen content, electrical conductivity, turbidity, and global parameters, such as total organic carbon.

BACKGROUND DISCUSSION

Measurement transmitters of the field of the invention for providing a measured value of at least one measured variable to a control system comprise: a sensor having an electrical transducer for outputting a primary signal dependent on the current value of the measured variable; a first electronic circuit for driving the transducer, for processing the primary signal and for outputting an intermediate signal dependent on the primary signal; a second electronic circuit for feeding the first electronic circuit and for processing the intermediate signal for producing a signal representing the measured value of the measured variable, wherein the second electronic circuit has a signal output for outputting the signal to connection lines; a housing arrangement, wherein the first electronic circuit has at least a first circuit carrier, and the second electronic circuit has at least a second circuit carrier, and wherein the first and second electronic circuits are positioned in the housing assembly spaced from one another. Frequently, the measurement transmitter is modularly embodied, so that the housing arrangement includes a first housing module and a second housing module, wherein the two housing modules are connected with one another. The first housing module contains the sensor and the first electronic circuit, while the second electronic circuit is arranged in the second housing module. The second housing module contains additionally a so-called terminal block where the connection lines are to be connected. Via the connection lines, high frequency disturbances in the region of some 100 MHz can get into the second housing module and via the signal path degrade the second and first electronic circuits. In order to prevent this, for example, the second housing module is embodied as a two chamber housing with a partition, which separates a connector space, which contains the terminal block, from the electronics compartment, in which the second electronic circuit is arranged. In the metal partition, which already acts as shielding, high frequency filters are provided, which are intended to attenuate the HF-signals. Such a measurement transmitter is described, for example, in WO 96/05483. The manufacture of a two chamber housing is, however, relatively expensive, since at least one additional housing opening with a corresponding housing lid must then be provided.

SUMMARY OF THE INVENTION

It is, consequently, an object of the present invention to provide a simpler solution for guarding against high frequency disturbances. The object is achieved according to the invention by a measurement transmitter of the invention for providing a measured value of at least one measured variable to a control system comprises: a sensor having an electrical transducer for outputting a primary signal dependent on the current value of the measured variable; a first electronic circuit for driving the transducer, for processing the primary signal and for outputting an intermediate signal dependent on the primary signal; a second electronic circuit for feeding the first electronic circuit and for processing the intermediate signal for producing a signal representing the measured value of the measured variable, wherein the second electronic circuit has a signal output for outputting the signal to connection lines; a housing arrangement, which has at least one metal material, wherein the first electronic circuit has at least a first circuit carrier, and the second electronic circuit has at least a second circuit carrier, and wherein the first and second electronic circuits are positioned in the housing arrangement spaced from one another; and an electrically conducting shielding and high frequency filters for protecting against HF disturbances, which can get into the housing arrangement via the connection lines; wherein according to the invention the electrically conducting shielding and the high frequency filters are arranged between the first circuit carrier and the second circuit carrier.

The metal material of the housing arrangement can comprise steel, especially stainless steel, aluminum and/or any alloys. The housing arrangement can be constructed as one piece or modularly with a plurality of housing modules. The housing arrangement can comprise especially machined parts, cast parts and/or deep drawn parts.

In a further development of the invention, the shielding includes an electrically insulating shield support having a metal shield layer, wherein the high frequency filter is separated by the shield layer from the second electronic circuit.

In a further development of the invention, the shield support includes at least one via, by way of which the second electronic circuit is connected with the first electronic circuit, wherein at least one of the electrical vias is galvanically isolated from the metal shield layer and annularly surrounded by the metal shield layer.

In a further development of the invention, the shielding includes at least one electrically conducting sleeve, which surrounds the at least one electrical via, is galvanically isolated from the via and in galvanic contact with the shield layer, wherein the sleeve especially is embedded in the shield support.

In a further development of the invention, the capacitance between the at least one via and the shielding amounts to no more than 2 nf, especially no more than 1 nf. This limiting of the capacitance does, on the one hand, limit the effect of the shielding, but, on the other hand, it also limits the energy stored in the capacitance sufficiently that the measurement transmitter qualifies, for example, as the ignition protection type, "intrinsically safe", respectively "Ex i".

In a further development of the invention, the at least one high frequency filter is arranged on the shield support, wherein the first electronic circuit is connected with the electrical via by way of the high frequency filter, wherein the separation of the high frequency filter from the via amounts to no more than 2 cm, preferably no more than 1.5 cm and especially preferably no more than 1 cm.

In a further development of the invention, the shield support is a separate, plate shaped component, which is installed in the housing arrangement.

The shielding can according to a further development be manufactured especially as a printed circuit board (PCB) and—apart from the regions of the vias—comprise a preferably closed metallizing, wherein the insulating foundation of the circuit board forms the shield support.

In a further development of the invention, the housing arrangement has an inner space, which in a plane, in which the shielding is arranged, has an inner cross sectional area, which is covered by the shielding by an amount not less than 75%, preferably not less than 80%, further preferably not less than 90% and especially preferably at least 98%.

In a further development of the invention, the metal shield layer lies at the potential of the electrically conducting material of the housing.

In a further development of the invention, the at least one high frequency filter includes at least one LC unit.

In a further development of the invention, the housing arrangement includes a first housing module and a second housing module, which are connected with one another, wherein the first housing module contains the sensor and the first electronic circuit, and wherein the second housing module contains the second electronic circuit and the shielding, wherein the second housing module has an opening, via which the first electronic circuit is connected with the second electronic circuit.

The shielding can be arranged in the first housing module or in the second housing module.

In a further development of the invention, an end section of the first housing module protrudes into the opening of the second housing module and is connected with a neck region of the second housing module surrounding the opening.

In a further development of the invention, the end section has an electrical feedthrough, via which the first electronic circuit is connected with the second electronic circuit, wherein the electrical feedthrough is hermetically sealed.

In a further development of the invention, the housing arrangement and the shield layer form a Faraday cage around the first electronic circuit.

In a further development of the invention, the sensor is a pressure sensor, a fill level sensor, a temperature sensor, a flow sensor, a humidity sensor, a density sensor, a viscosity sensor, a conductivity sensor, a potentiometric sensor, an amperometric sensor, or an optical sensor.

BRIEF DESCRIPTION OF THE DRAWING

The invention will now be explained based on the example of an embodiment illustrated in the drawing, the sole FIGURE of which shows as follows:

FIG. 1 is a schematic longitudinal section through an example of an embodiment of a measurement transmitter of the invention.

DETAILED DISCUSSION IN CONJUNCTION WITH THE DRAWING

The example of an embodiment of a measurement transmitter of the invention shown in FIG. 1 is a pressure measurement transmitter having a metal electronics housing 1a, which is manufactured as a cast part and closed with a metal lid 1b. The electronics housing 1a is superimposed on a metal sensor housing 2, which is made especially of stainless steel. The measurement transmitter includes a bushing 3 in a lateral surface of the electronics housing 1a, which has essentially a cylindrical shape, wherein supply and signal lines 4 are led through the bushing 3 into the electronics housing 1a, in order to supply the measurement transmitter with energy and to forward its measuring signals.

The supply and signal lines 4 are connected via a terminal block 5 to a so-called main electronics 6 of the measurement transmitter, which corresponds to the second electronic circuit according to the definition of the invention. Main electronics 6 is, in turn, connected to the shield arrangement 9 by means of a connecting line 7 and plug connectors 8. The shield arrangement comprises a circuit board, which is arranged in an end section of the essentially cylindrical sensor housing 2 facing the electronics housing 1a and essentially completely metallized on a first side facing the electronics housing 1a, except for the region of vias 10, and is in galvanic contact with the sensor housing 2. Arranged on a second side of the circuit board 9 facing away from the electronics housing 1a are HF filters 11, which are connected, on the one hand, to the vias 10, and, on the other hand, to a so-called flex connector 12, wherein the flex connector 12 is connected via a plug connector 13 to a so-called sensor electronics 14, which corresponds to the first electronic circuit according to the definition of the invention. Located at an end opening of the sensor housing facing away from the electronics housing 1a is a pressure sensor, for example, a pressure sensor having a ceramic platform 15 and a ceramic measuring membrane, or diaphragm, 16, which is connected pressure-tightly with the platform, wherein the pressure sensor comprises a capacitive transducer, which has a first electrode on the side of the measuring membrane 16 facing the platform and at least a second electrode on the side of the platform 15 facing the measuring membrane. The first electrode extends preferably over the entire area of the measuring membrane 16 and is, for example, in galvanic contact with the sensor housing. The capacitance between the first electrode and the second electrode is a measure for a pressure bearing on the outside of the measuring membrane 16.

The sensor electronics 14 is arranged on the rear-side of the platform 15 facing away from the measuring membrane. It drives the capacitive transducer and provides an intermediate signal, especially a digitized intermediate signal, which is transmitted by way of the flex conductor 12, the HF filters 11, the vias 10 and the connecting line 7 to the main electronics 6.

The main electronics processes the intermediate signal and produces an output signal on the connection lines 4, for example, an analog 4-20 mA electrical current signal, which represents the measured value.

Although HF disturbances can get into the electronics housing 1a via the connection lines and these disturbances may be tolerated by the main electronics, the shield arrangement with the metallized circuit board 9 and the HF filters 11 prevents that the output of the more sensitive sensor electronics, which has to process very weak analog signals, is degraded by HF disturbances.

The circuit board 9 has, for example, a thickness of 1.5 mm, wherein the vias 10 extend essentially perpendicularly to the plane of the circuit board. The metallizing of the circuit board 9 has for each via 10 a perforation with a radius of, for example, 3.5 mm, wherein a sleeve shaped annular electrode with the radius of the perforation is led coaxially around the via 10 over a length of at least 50%, preferably not less than 75%, of the circuit board thickness into the circuit board around the via to shield against HF disturbances. The radius of the annular electrode of, for example, 3.5 mm is so selected that the capacitance between the annular electrode and the conductor of the via 10 is compatible with the ignition protection type "intrinsically safe" (Ex i).

The invention claimed is:

1. A measurement transmitter for providing a measured value of at least one measured variable to a control system, comprising:
 a sensor having an electrical transducer for outputting a primary signal dependent on the current value of the measured variable;
 a first electronic circuit for driving said transducer, for processing the primary signal and for outputting an intermediate signal dependent on the primary signal;

a second electronic circuit for feeding said first electronic circuit and for processing the intermediate signal for producing a signal representing the measured value of the measured variable, said second electronic circuit has a signal output for outputting the signal to connection lines;

a housing arrangement, which has at least one electrically conducting material, especially a metal material, said first electronic circuit has at least a first circuit carrier, and said second electronic circuit has at least a second circuit carrier, said first and second electronic circuits are positioned in said housing arrangement spaced from one another; and an electrically conducting shielding and high frequency filters for protecting against HF disturbances, which can get into said housing arrangement via the connection lines, wherein:

said electrically conducting shielding and said high frequency filters are arranged between said first circuit carrier and said second circuit carrier;

said shielding includes an electrically insulating shield support having a metal shield layer;

said high frequency filter is separated by the shield layer from the second electronic circuit, said shield support includes at least one via, by way of which said second electronic circuit is connected with said first electronic circuit;

at least one of the electrical vias is galvanically isolated from said metal shield layer and annularly surrounded by said metal shield layer;

the capacitance between said via and the shielding amounts to no more than 1 nf;

said at least one high frequency filter is arranged on said shield support;

said first electronic circuit is connected with said electrical via by way of said high frequency filter;

the separation of said high frequency filter from said via amounts to no more than 1 cm;

said shielding includes at least one electrically conducting annular sleeve shaped electrode, which surrounds said at least one electrical via, is galvanically isolated from said via and in galvanic contact with said shield layer;

said sleeve shaped electrode is embedded in said shield support; and the radius of said sleeve shaped electrode is so selected that the capacitance between the annular electrode and the conductor of the via is compatible with the ignition protection type "intrinsically safe" (Ex i);

said metal shield layer is in galvanic contact with the electrically conducting material of said housing;

said housing arrangement and said shield layer form a Faraday cage around said first electronic circuit; and said shield support is a separate, plate shaped component, which is installed in said housing arrangement.

2. The measurement transmitter as claimed in claim 1, wherein:

said housing arrangement has an inner space, which in a plane, in which said shielding is arranged, has an inner cross sectional area, which is covered by said shielding by an amount not less than 75%, preferably not less than 80%, further preferably not less than 90% and especially preferably at least 98%.

3. The measurement transmitter as claimed in claim 1, wherein:

said at least one high frequency filter includes at least one LC unit.

4. The measurement transmitter as claimed in claim 1, wherein:

said housing arrangement includes a first housing module and a second housing module, which are connected with one another;

said first housing module contains said sensor, said first electronic circuit and said shielding;

said second housing module contains said second electronic circuit; and said second housing module has an opening, via which said first electronic circuit is connected with the second electronic circuit.

5. The measurement transmitter as claimed in claim 4, wherein:

an end section of said first housing module protrudes into the opening of said second housing module and is connected with a neck region of said second housing module surrounding the opening.

6. The measurement transmitter as claimed in claim 1, wherein:

said sensor is one of: a pressure sensor, a fill level sensor, a temperature sensor, a flow sensor, a humidity sensor, a density sensor, a viscosity sensor, a conductivity sensor, a potentiometric sensor, an amperometric sensor, and an optical sensor.

* * * * *